(12) United States Patent
Machida et al.

(10) Patent No.: US 8,569,132 B2
(45) Date of Patent: Oct. 29, 2013

(54) SEMICONDUCTOR DEVICE AND MANUFACTURING METHOD THEREOF

(75) Inventors: Nobuo Machida, Kanagawa (JP); Koichi Arai, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/361,010

(22) Filed: Jan. 30, 2012

(65) Prior Publication Data

US 2012/0193702 A1 Aug. 2, 2012

(30) Foreign Application Priority Data

Jan. 31, 2011 (JP) ................................ 2011-017595

(51) Int. Cl.
*H01L 21/336* (2006.01)
(52) U.S. Cl.
USPC ........... 438/268; 438/433; 257/329; 257/341; 257/342; 257/77
(58) Field of Classification Search
USPC ....................... 257/77, 329, 341–342, E21.41, 257/E29.262; 438/268, 433
See application file for complete search history.

(56) References Cited

U.S. PATENT DOCUMENTS

| 6,096,607 A | * | 8/2000 | Ueno ............................ 438/268 |
| 2010/0035420 A1 | | 2/2010 | Tamaso et al. |

FOREIGN PATENT DOCUMENTS

| JP | 2008-108869 A | 5/2008 |
| JP | 2008-147576 A | 6/2008 |

* cited by examiner

*Primary Examiner* — Theresa T Doan
(74) *Attorney, Agent, or Firm* — Miles & Stockbridge P.C.

(57) ABSTRACT

In a SiC-based MISFET and a manufacturing process thereof, after the introduction of an impurity, extremely-high-temperature activation annealing is required. Accordingly, it is difficult to frequently use a self-alignment process as performed in a silicon-based MISFET manufacturing process. This results in the problem that, to control the characteristics of a device, a high-accuracy alignment technique is indispensable. In accordance with the present invention, in a semiconductor device such as a SiC-based vertical power MISFET using a silicon-carbide-based semiconductor substrate and a manufacturing method thereof, a channel region, a source region, and a gate structure are formed in mutually self-aligned relation.

7 Claims, 15 Drawing Sheets

SEMICONDUCTOR DEVICE AND MANUFACTURING METHOD THEREOF

CROSS-REFERENCE TO RELATED APPLICATIONS

The disclosure of Japanese Patent Application No. 2011-17595 filed on Jan. 31, 2011 including the specification, drawings and abstract is incorporated herein by reference in its entirety.

BACKGROUND

The present invention relates to a technology which is effective when applied to a self-alignment technique in a semiconductor device (or semiconductor integrated circuit device) such as a MOSFET (Metal Oxide Semiconductor Field Effect Transistor) or MISFET (Metal Insulator Semiconductor Field Effect Transistor) and a manufacturing method thereof.

Japanese Unexamined Patent Publication No 2008-108869 (Patent Document 1) discloses a technique in which, with regard to a manufacturing method of a SiC-semiconductor-based vertical N-channel MOSFET or MISFET, the width of a resist mask is self-alignedly increased by a heat treatment to form source regions and channel regions (P base regions) by self alignment. The publication also discloses a technique in which, after a heat treatment for the source regions and the channel regions, a gate structure is formed.

Japanese Unexamined Patent Publication No. 2008-147576 (Patent Document 2) or US Patent Publication No. 2010-35420 (Patent Document 3) corresponding thereto discloses a technique in which, with regard to a manufacturing method of a SiC-semiconductor-based vertical N-channel MOSFET or MISFET, the width of a tungsten hard mask is reduced to form source regions and channel regions by self alignment. The publication also discloses a technique in which, after a heat treatment for the source regions and the channel regions, a gate structure is formed.

RELATED ART DOCUMENTS

Patent Documents

[Patent Document 1]
 Japanese Unexamined Patent Publication No. 2008-108869
[Patent Document 2]
 Japanese Unexamined Patent Publication No. 2008-147576
[Patent Document 3]
 US Patent Publication No. 2010-35420

SUMMARY

In a SiC-based MISFET manufacturing process, after the introduction of an impurity, extremely-high-temperature activation annealing is required. Accordingly, it is difficult to frequently use a self-alignment process as performed in a silicon-based MISFET manufacturing process. This results in the problem that, to control the characteristics of a device, a high-accuracy alignment technique is indispensable.

The present invention has been achieved to solve such a problem.

An object of the present invention is to provide a semiconductor device and a manufacturing process thereof which allow frequent use of a self-alignment technique.

The above and other objects and novel features of the present invention will become apparent from a statement in the present specification and the accompanying drawings.

The following is a brief description of the outline of a representative embodiment of the invention disclosed in the present application.

That is, according to an aspect of the present invention, in a semiconductor device such as a SiC-based vertical power MISFET using a silicon-carbide-based semiconductor substrate and a manufacturing method thereof, a channel region, a source region, and a gate structure are formed in mutually self-aligned relation.

The following is a brief description of an effect obtained according to the representative embodiment of the invention disclosed in the present application.

That is, in a semiconductor device such as a SiC-based vertical power MISFET using a silicon-carbide-based semiconductor substrate and a manufacturing method thereof, a channel region, a source region, and a gate structure are formed in mutually self-aligned relation. This allows precise control of the characteristics of a device to be performed relatively easily.

DETAILED DESCRIPTION

[Outline of Embodiment]

Figure 1:
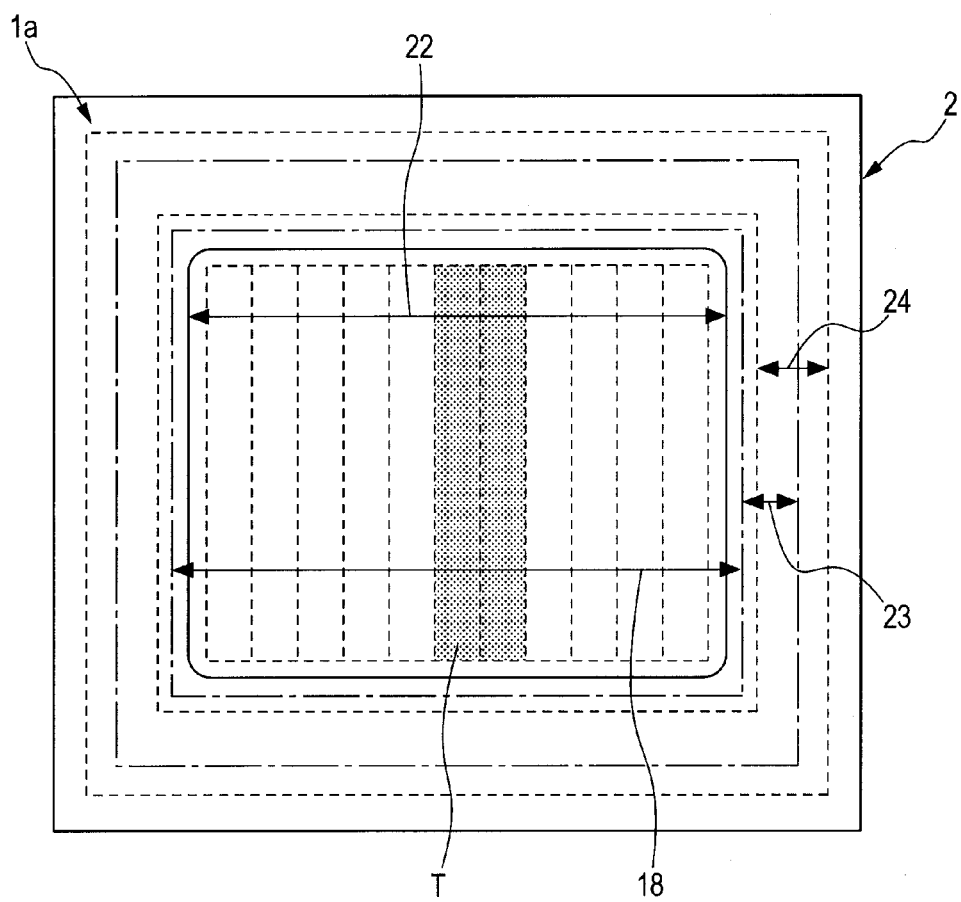
FIG. 1 is a top view of an example of a target device chip in a manufacturing method of a semiconductor device of an embodiment of the present invention.

First, a description will be given to the outline of a representative embodiment of the invention disclosed in the present application.

1. A method of manufacturing a semiconductor device includes the steps of: (a) preparing a semiconductor wafer having, in a first main surface of a silicon-carbide-based semiconductor substrate having a first conductivity type, a first silicon-carbide-based semiconductor layer having the same conductivity type as the first conductivity type and a concentration lower than that of the semiconductor substrate; (b) introducing, into a surface region of the first siliconcarbide-based semiconductor layer closer to the first main surface, a second-conductivity-type region having a second conductivity type opposite to the first conductivity type and serving as a channel region of a vertical power MISFET; (c) introducing a source region of the vertical power MISFET having the same conductivity type as the first conductivity type and a concentration higher than that of the first silicon-carbide-based semiconductor layer in self-aligned relation with the second-conductivity-type region; and (d) forming a gate structure of the vertical power MISFET in self-aligned relation with the source region.

2. In the method of manufacturing a semiconductor device according to article 1, the first silicon-carbide-based semiconductor layer is an epitaxial layer.

3. The method of manufacturing a semiconductor device according to article 1 or 2 further includes the step of: (e) after the step (c) and prior to the step (d), performing an activation anneal treatment for the second-conductivity-type region and the source region.

4. In the method of manufacturing a semiconductor device according to any one of articles 1 to 3, self-alignment of the source region with the second-conductivity-type region is performed using sidewalls each formed of a silicon-based insulating film.

5. In the method of manufacturing a semiconductor device according to any one of articles 1 to 4, self-alignment of the gate structure with the source region is performed using an opening pattern of a carbon film.

6. In the method of manufacturing a semiconductor device according to any one of articles 1 to 5, the semiconductor substrate is of an N-type.

7. In the method of manufacturing a semiconductor device according to any one of articles 1 to 6, the first silicon-carbide-based semiconductor layer is of the N-type.

8. In the method of manufacturing a semiconductor device according to any one of articles 1 to 7, a gate insulating film forming the gate structure is a thermal oxide film.

9. In the method of manufacturing a semiconductor device according to any one of articles 1 to 7, a gate insulating film forming the gate structure is an insulating film deposited by CVD.

10. In the method of manufacturing a semiconductor device according to article 9, the CVD is ALD.

11. In the method of manufacturing a semiconductor device according to article 9 or 10, the gate insulating film forming the gate structure has an alumina-based insulating film.

12. The method of manufacturing a semiconductor device according to any one of articles 9 to 11 further includes the step of: (f) after the step (e) and prior to the step (d), enlarging the opening pattern of the carbon film by dimension substantially equal to a thickness of the gate insulating film.

13. In the method of manufacturing a semiconductor device according to any one of articles 1 to 12, a polytype of the semiconductor substrate is 4 H.

14. In the method of manufacturing a semiconductor device according to any one of articles 1 to 13, the first main surface of the semiconductor substrate is a (0001) plane or a plane equivalent thereto.

15. A method of manufacturing a semiconductor device includes the steps of: (a) preparing a semiconductor wafer having, in a first main surface of a silicon-carbide-based semiconductor substrate having a first conductivity type, first silicon-carbide-based semiconductor layer having the same conductivity type as the first conductivity type and a concentration lower than that of the semiconductor substrate; (b) introducing, into a surface region of the first silicon-carbide-based semiconductor layer closer to the first main surface, a second-conductivity-type region having a second conductivity type opposite to the first conductivity type and serving as a channel region of a vertical power MISFET; (c) introducing a source region of the vertical power MISFET having the same conductivity type as the first conductivity type and a concentration higher than that of the first silicon-carbide-based semiconductor layer in self-aligned relation with the second-conductivity-type region; (d) performing an activation anneal treatment for the second-conductivity-type region and the source region; and (e) after the step (d), forming a gate structure of the vertical power MISFET. In the method of manufacturing a semiconductor device, self-alignment of the source region with the second-conductivity-type region is performed using sidewalls each formed of a silicon-based insulating film.

16. In the method of manufacturing a semiconductor device according to article 15, the first silicon-carbide-based semiconductor layer is an epitaxial layer.

17. In the method of manufacturing a semiconductor device according to article 15 or 16, the semiconductor substrate is of an N-type.

18. In the method of manufacturing a semiconductor device according to any one of articles 15 to 17, the first silicon-carbide-based semiconductor layer is of the N-type.

19. In the method of manufacturing a semiconductor device according to any one of articles 15 to 18, a gate insulating film forming the gate structure is a thermal oxide film.

20. In the method of manufacturing a semiconductor device according to any one of articles 15 to 18, a gate insulating film forming the gate structure is an insulating film deposited by CVD.

21. In the method of manufacturing a semiconductor device according to article 20, the CVD is ALD.

22. In the method of manufacturing a semiconductor device according article 21, the gate insulating film forming the gate structure has an alumina-based insulating film.

23. In the method of manufacturing a semiconductor device according to any one of articles 15 to 22, a polytype of the semiconductor substrate is 4 H.

24. In the method of manufacturing a semiconductor device according to any one of articles 15 to 23, the first main surface of the semiconductor substrate is a (0001) plane or a plane equivalent thereto.

25. A semiconductor device includes: a silicon-carbide-based semiconductor substrate having a first main surface having a first conductivity type, the silicon-carbide-based semiconductor substrate including: a first silicon-carbide-based semiconductor layer having the same conductivity type as the first conductivity type and a concentration lower than that of the silicon carbide-based semiconductor substrate; channel region having a second conductivity type and formed in a surface region of the first silicon-carbide-based semiconductor layer closer to the first main surface; a source region having the first conductivity type and a concentration higher than that of the first silicon-carbide-based semiconductor layer and formed in self-aligned relation with the channel region; and a gate structure formed in self-aligned relation with the source region.

26. In the semiconductor device according to article 25, the semiconductor device is a vertical MISFET.

27. In the semiconductor device according to article 25 or 26, the first silicon-carbide-based semiconductor layer is an epitaxial layer.

28. In the semiconductor device according to any one of articles 25 to 27, self-alignment of the source region with the second-conductivity-type region is performed using sidewalls each formed of a silicon-based insulating film.

29. In the semiconductor device according to any one of articles 25 to 28, self-alignment of the gate structure with the source region is performed using an opening pattern of a carbon film.

[Explanation of Description Form, Basic Terminology, and Use thereof in Present Application]

1. In the present application, if necessary for the sake of convenience, the description of an embodiment may be such that the embodiment is divided into a plurality of sections in the description thereof. However, they are by no means independent of or distinct from each other unless particularly explicitly described otherwise, and one of the individual sections of a single example is details, variations, and so forth of part or the whole of the others. In principle, a repeated description of like parts will be omitted. Each constituent element in the embodiment is not indispensable unless particularly explicitly described otherwise, unless the constituent element is theoretically limited to a given number, or unless it is obvious from the context that the constituent element is indispensable.

Also in the present application, when a "semiconductor chip", "semiconductor device", or "semiconductor integrated circuit device" is mentioned, it primarily refers to various stand-alone transistors (active elements) and to a device in which a resistor, a capacitor, a diode, and the like are integrated around such a stand-alone transistor over a semiconductor chip or the like (examples of a material for the semiconductor chip include a single-crystal SiC substrate, a single-crystal silicon substrate, a composite substrate thereof, and the like. As a crystal polymorph of SiC, 4 H-SiC is primarily referred to, but it will be appreciated that another crystal polymorph may also be referred to).

In the present application, when an "electronic circuit device" is mentioned, it indicates a semiconductor chip, a semiconductor device, a semiconductor integrated circuit device, a resistor, a capacitor, a diode, or the like and an interconnected system thereof.

Here, representative examples of the various transistors that can be shown include a MISFET. By forming a large number of the MISFETs in parallel to allow handling of high power, a power MISFET is obtained. Power MISFETs include a vertical MISFET and a lateral MISFET. In the present application, a specific description will be given mainly to the vertical MISFET. Such vertical MISFETs include a Planar type and a Trench type. In the present application, a specific description will be given mainly to the planar type.

In these days, each of the source and gate metal electrodes of a power-type electronic circuit device, semiconductor device, or semiconductor integrated circuit device is normally and mostly formed of one layer which is, e.g., an aluminum-based (or refractory-metal-based, e.g., tungsten-based) wiring layer M1 or two layers which are aluminum-based (or refractory-metal-based, e.g., tungsten-based) wiring layers M1 and M2. Note that, as such wiring layers, copper-based wiring layers are used occasionally.

2. Likewise, even when such wording as "X comprised of A" is used in association with a material, a composition, or the like in the description of the embodiment or the like, it does not exclude a material, a composition, or the like which contains an element other than A as one of the main constituent elements thereof unless particularly explicitly described otherwise or unless it is obvious from the context that it excludes such a material, composition, or the like. For example, when a component is mentioned, the wording means "X containing A as a main component" or the like. It will be appreciated that, even when, e.g., a "silicon member", "SiC (silicon carbide) member", or the like is mentioned, it is not limited to pure silicon or SiC, and a member containing a multi-element semiconductor containing silicon or SiC as a main component, another additive, or the like is also included. Likewise, it will also be appreciated that, even when a "silicon oxide film", "silicon-oxide-based insulating film", or the like is mentioned, it includes not only a relatively pure Undoped Silicon Dioxide, but also a thermal oxide film of FSG (Fluorosilicate Glass), TEOS-based silicon oxide, SiOC (Silicon Oxicarbide), Carbon-doped Silicon oxide, OSG (Organosilicate glass), PSG (Phosphorus Silicate Glass), BPSG (Borophosphosilicate Glass), or the like, a CVD oxide film, a coated silicon oxide such as SOG (Spin ON Glass) or NCS (Nano-Clustering Silica), a silica-based Low-k insulating film (porous insulating film) obtained by introducing voids into the same member as mentioned above, a composite film with another silicon-based insulating film which contains any of these mentioned above as a main constituent element thereof, and the like.

As a silicon-based insulating film commonly used in a semiconductor field along with a silicon-oxide-based insulating film, there is a silicon-nitride-based insulating film. Materials belonging to this system include SiN, SiCN, SiNH, SiCNH, and the like. Here, when "silicon nitride" is mentioned, it includes both of SiN and SiNH unless particularly explicitly described otherwise. Likewise, when "SiCN" is mentioned, it includes both of SiCN and SiCNH unless particularly explicitly described otherwise.

3. Likewise, it will also be appreciated that, although a preferred example is shown in association with a graphical figure, a position, an attribute, or the like, the graphical figure, position, attribute, or the like is not strictly limited thereto unless particularly explicitly described otherwise or unless it is obvious from the context that the graphical figure, position, attribute, or the like is strictly limited thereto.

4. Further, when a specific numerical value or numerical amount is mentioned, it may be a value more or less than the specific numerical value unless particularly explicitly described otherwise, unless the numerical value is theoretically limited to a given number, or unless it is obvious from the context that the numeral value is limited to a given number.

5. When a "wafer" is mentioned, it typically refers to a single-crystal silicon carbide wafer, a single-crystal silicon wafer, or the like over which a semiconductor integrated circuit device (the same as a semiconductor device or an electronic device) is formed. However, it will be appreciated that the "wafer" also includes a composite wafer of an insulating substrate and a semiconductor layer or the like, such as an epitaxial wafer or an LCD glass substrate.

6. In the present application, when an "ordinary temperature" or "room temperature" is mentioned, it commonly refers to a temperature of,. e.g., about 25° C. or a range of, e.g., about 15° C. to about 35° C.

In the present application, when the wording "A is formed in self-aligned relation with B" is used, it shows that B is formed substantially in alignment with A without performing a special alignment step for aligning B with A. Also, when the wording "A, B, and C are in mutually self-aligned relation" is used, it shows that one of at least two of A, B, and C are in self-aligned relation with the remaining one, while the other of the two is in self-aligned relation with the remaining one or the one of the two.

In the present application, a "gate structure" refers to a structure including a gate insulating film, a gate electrode (a portion actually functioning as a gate, such as a polysilicon gate electrode), and the like. Therefore, an upper-layer metal gate electrode and the like are excluded therefrom.

[Details of Embodiment]

An embodiment will be described in greater detail. In each of the drawings, the same or like parts are designated by the same or similar marks or reference numerals, and a description thereof will not be repeated in principle.

In the accompanying drawings, hatching or the like may be omitted even in a cross section when hatching or the like results in complicated illustration or when the distinction between a portion to be hatched and a vacant space is distinct. In relation thereto, even a two-dimensionally closed hole may have a background outline thereof omitted when it is obvious from the description or the like that the hole is two-dimensionally closed, and so forth. On the other hand, even though not shown in a cross section, a portion other than a vacant space may be hatched to clearly show that the hatched portion is not a vacant space.

1. Description of Example of Target Device, etc. in Manufacturing Method of Semiconductor Device of Embodiment of Present Invention (See Mainly FIGS. 1 to 3)

Note that, here, to give a specific description, device having a source/drain breakdown voltage of about 800 to 1000 V is assumed and described.

Figure 2:
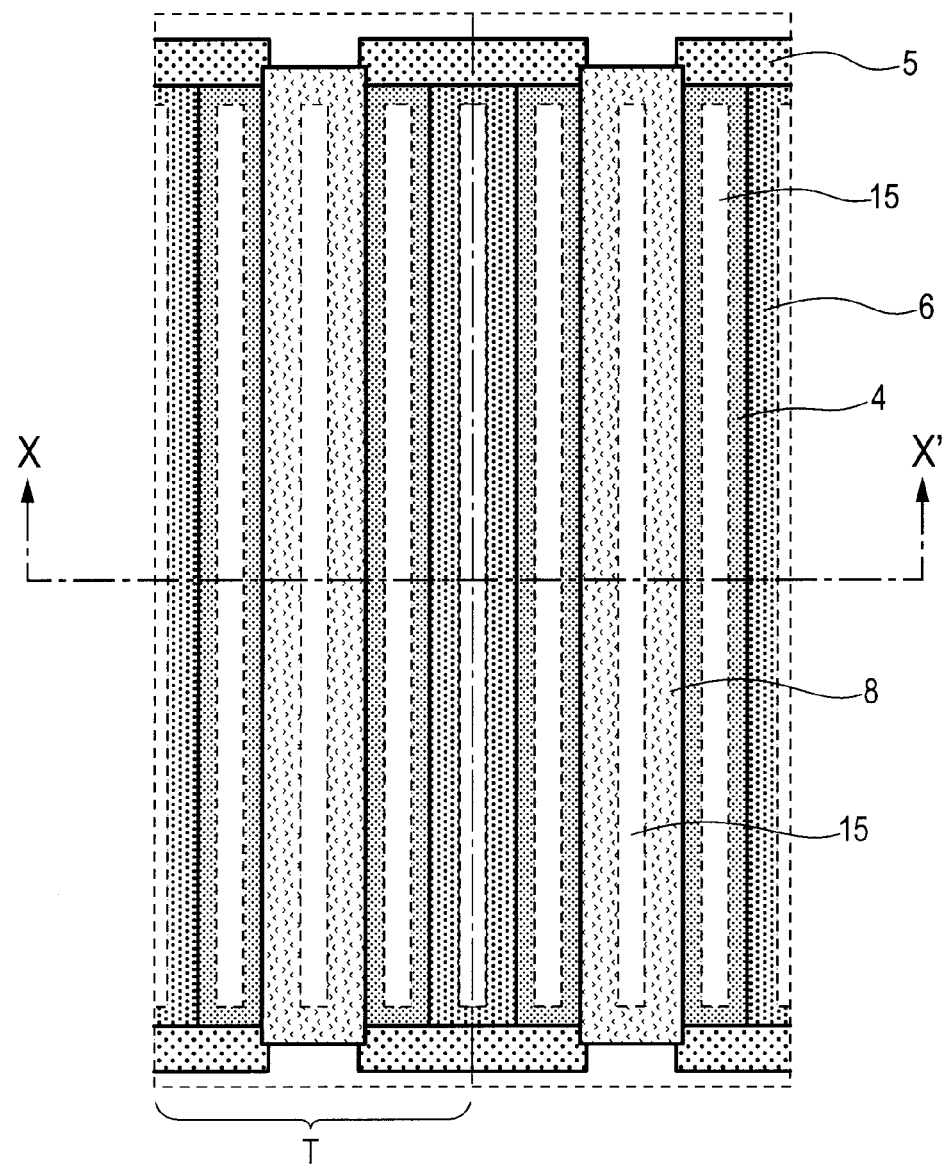
FIG. 2 is an enlarged top view of two periods of a unit periodic region T in the active cell of FIG. 1.
Figure 3:
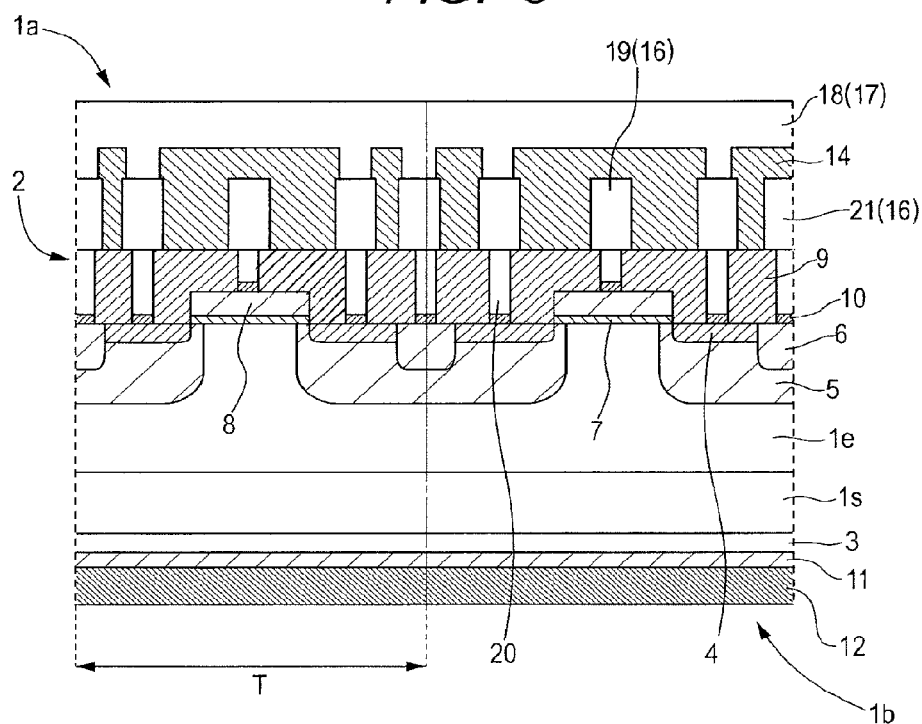
FIG. 3 is a device cross-sectional view corresponding to the X-X' cross section of FIG. 2.

FIG. 1 is a top view of an example of a target device chip in the manufacturing method of the semiconductor device of the embodiment of the present invention. FIG. 2 is an enlarged top view of two periods of a unit periodic region T in the active cell of FIG. 1. FIG. 3 is a device cross-sectional view corresponding to the X-X' cross section of FIG. 2. Based on these drawings, a description will be given to an example of a structure of the target device in the manufacturing method of the semiconductor device of the embodiment of the present invention.

First, FIG. 1 shows an upper-surface overall view of an example of a target device chip 2 in the manufacturing method of the semiconductor device of the embodiment of the present invention. As shown in FIG. 1, in the vicinity of the outer periphery of a top surface 1a (first main surface) of a semiconductor chip 2, a gate metal electrode 24 (including a gate pad) is provided while, in the middle portion thereof, an active cell region 22 is provided. The active cell region 22 includes a large number of the unit periodic regions T and the like. The upper surface of the active cell region 22 and the periphery thereof are covered with a source metal electrode 18 (including a source pad). Around the active cell region 22, a ring-like P+ edge termination area 23 is provided so as to surround the active cell region 22. Note that the P+ edge termination area 23 is formed simultaneously with, e.g., P-type channel regions 5 (P well regions, P base regions, or second-conductivity-type regions) described later using FIG. 2 or the like.

Based on FIGS. 2 and 3, a detailed structure of each of the unit periodic regions T will be described. As shown in FIG. 2 or 3, in the back surface 1b of an N-type substrate 1s (first-conductivity-type substrate) of the semiconductor chip 2, an N+ drain region 3 is provided and, over the chip back surface 1b, a back-surface metal electrode film 12 is provided via a back-surface silicide film 11. In the top surface 1a of the N-type substrate 1s (first-conductivity-type substrate), an N-epitaxial layer 1e (SiC epitaxial layer or first silicon-carbide-based semiconductor layer) forming a drift region is provided. In the surface region of the N-epitaxial layer 1e, the P-type channel regions 5 (P well regions, P base regions, or second-conductivity-type regions) are provided. In the surface regions of the P-type channel regions 5, N+ source regions 4 and P+ contact regions 6 are provided. Over the top surface of the N-epitaxial layer 1e, gate electrodes 8 (or gate electrode polysilicon films) are formed via gate insulating films 7, and a first-layer interlayer insulating film 9 is formed so as to cover such gate structures 30. In contact holes 15 provided in the first-layer interlayer insulating film 9, tungsten plugs 20 are provided via surface silicide films 10. Over the upper surface of the first-layer interlayer insulating film 9, source lead-out metal wires 21 and gate lead-out metal wires 19 which are formed of first-layer surface metal films 16 are formed. Further, over the upper surface of the first-layer interlayer insulating film 9, a second-layer interlayer insulating film 14 is formed so as to cover the first-layer surface metal films 16. Over the second-layer interlayer insulating film 14, a source metal electrode 18 (source pad) formed of a second-layer surface metal film 17 coupled to the source lead-out metal wires 21 via through holes is formed.

2. Description of Manufacturing Process in Manufacturing Method of Semiconductor Device of Above Embodiment of Present Invention (See Mainly FIGS. 4 to 19)

In the following process, a wafer temperature in ion implantation is, e.g., about 400° C. (relatively high temperature) when an ion species is nitrogen, but ion implantation is performed at, e.g., an ordinary temperature or a room temperature when an ion species is other than nitrogen. Note that the temperatures mentioned above are only exemplary, and temperatures (higher temperatures or a cooled state under 15° C.) other than those mentioned above are not to be excluded.

Figure 4:
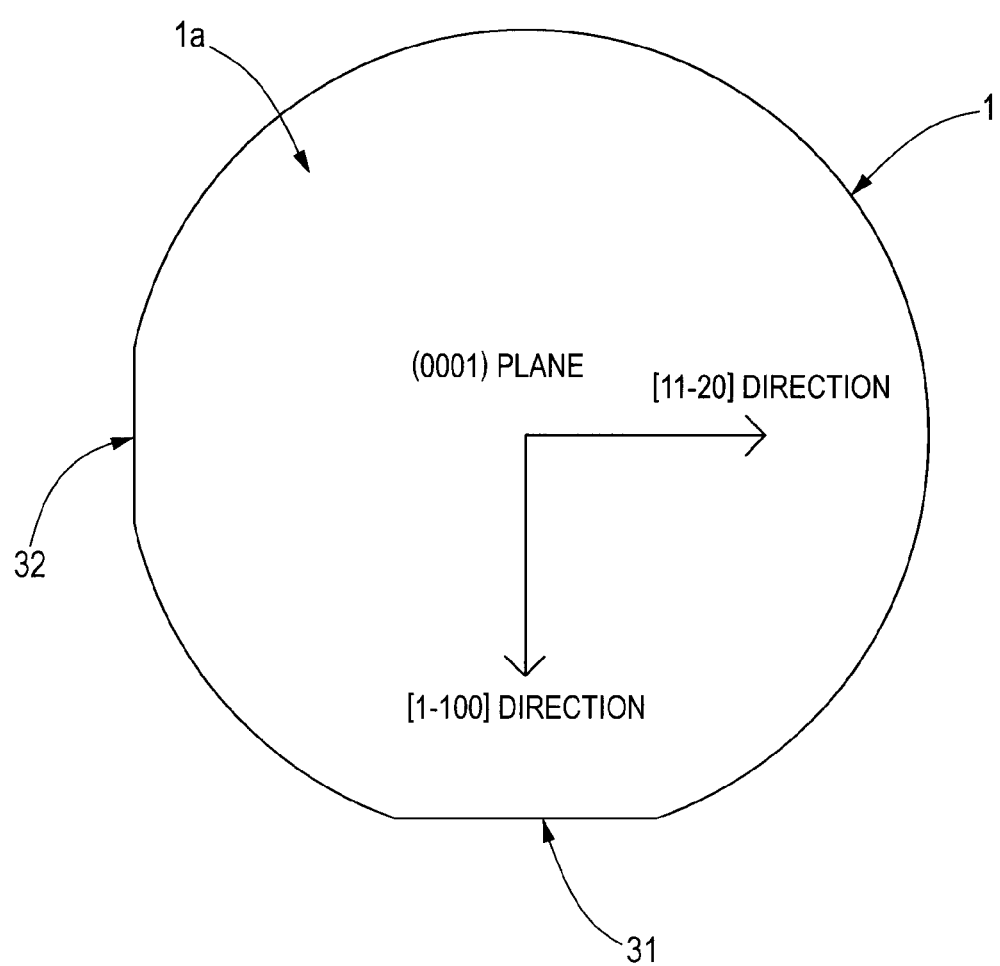
FIG. 4 is an overall top view of a single-crystal SiC wafer (epitaxial wafer) used in the manufacturing method of the semiconductor device of the embodiment of the present invention.
Figure 5:
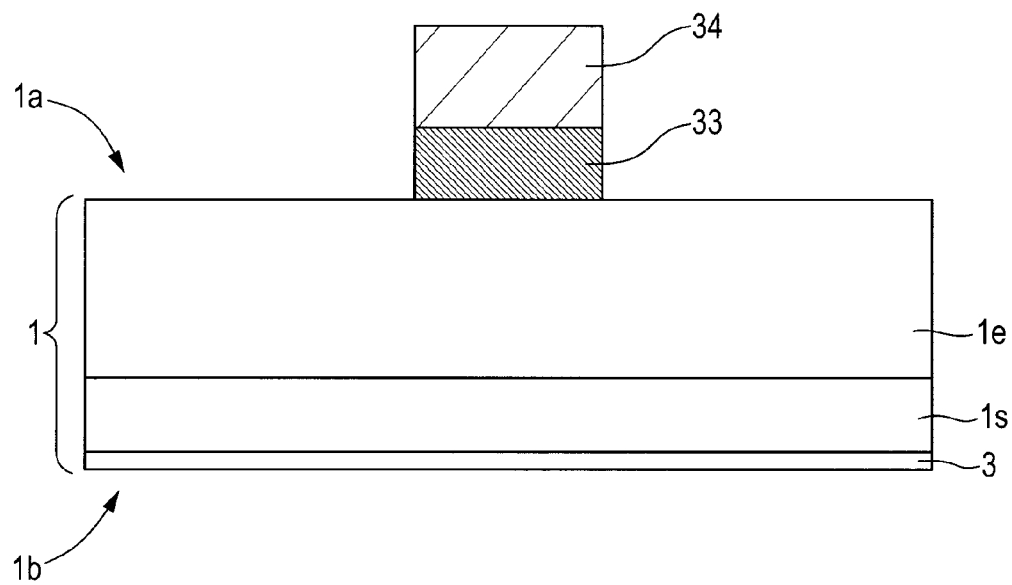
FIG. 5 is a device cross-sectional view for illustrating the manufacturing method of the semiconductor device of the embodiment of the present invention, which is a device cross-sectional view of a portion corresponding to the unit periodic region T in the active cell of FIG. 3 in an individual manufacturing step (step of forming a hard mask for introducing channel regions)
Figure 6:
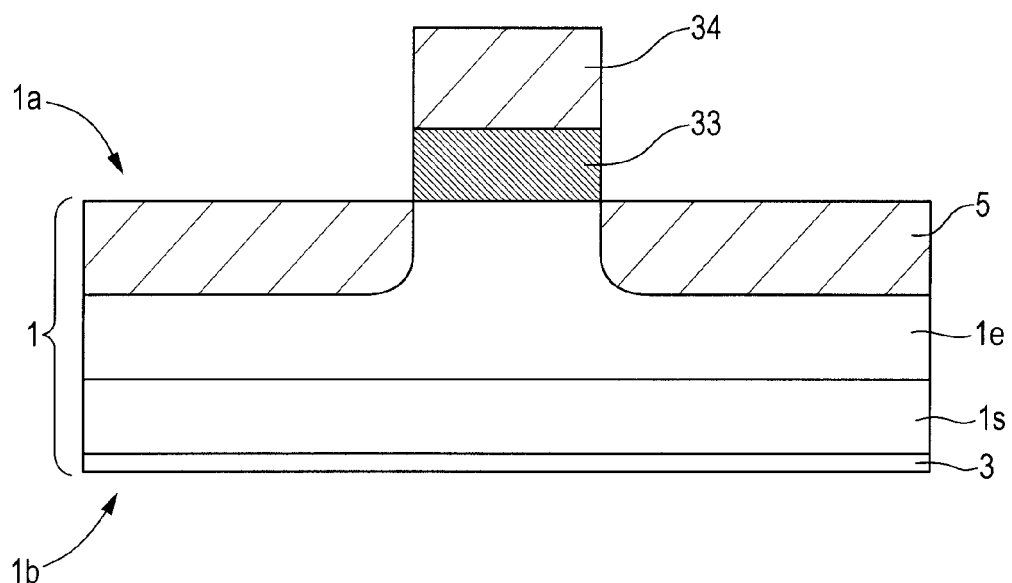
FIG. 6 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of introducing the channel regions)
Figure 7:
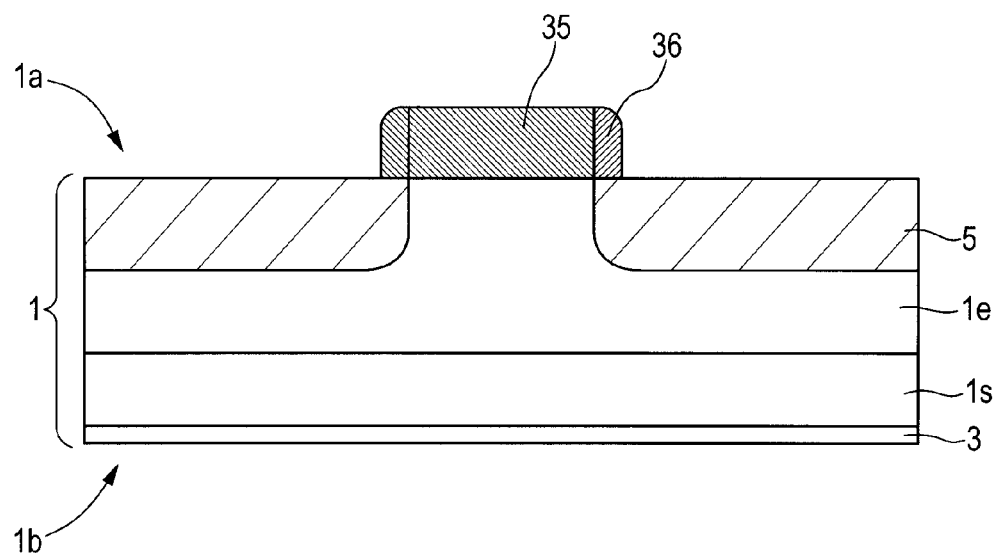
FIG. 7 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of forming sidewalls)
Figure 8:
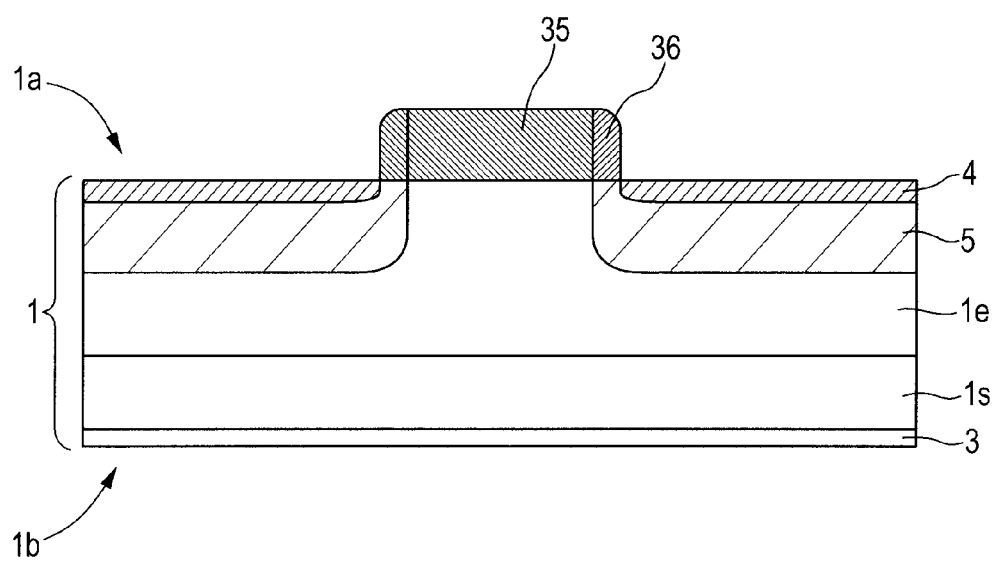
FIG. 8 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of introducing N+ source regions)
Figure 9:
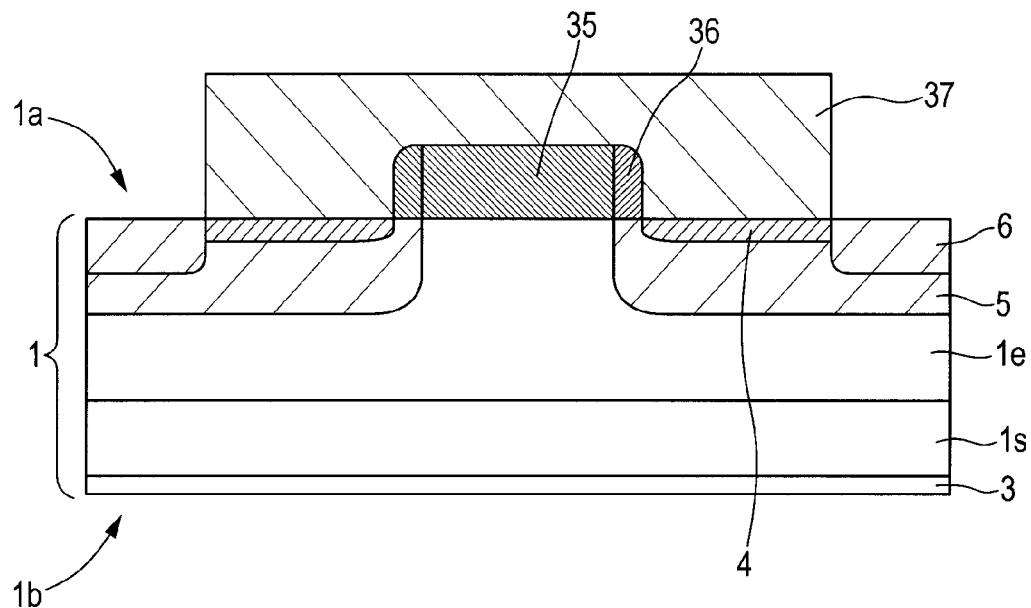
FIG. 9 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of introducing P+ contact regions)
Figure 10:
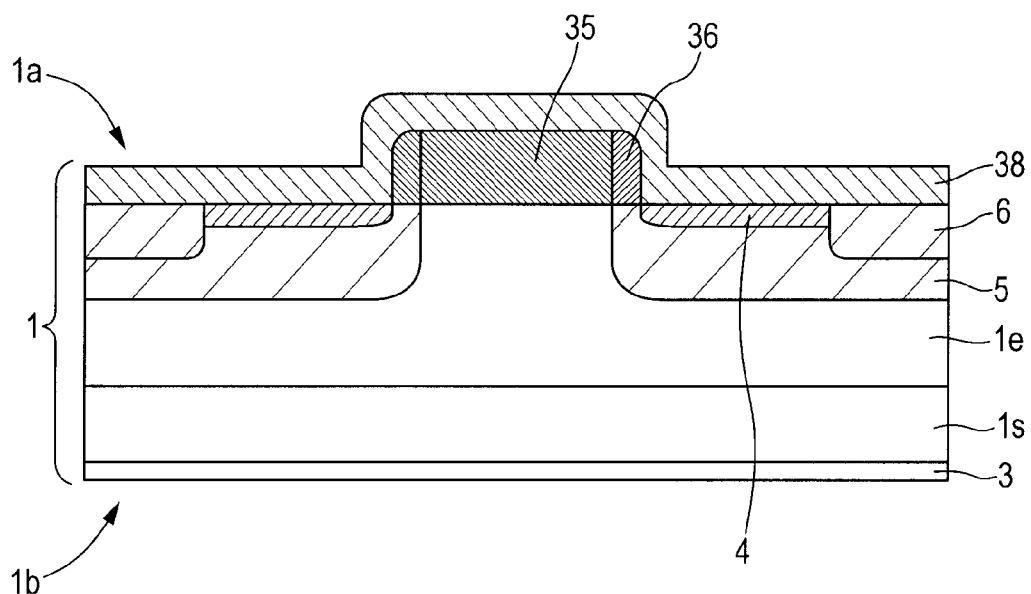
FIG. 10 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of forming a thick carbon film for high-temperature heat treatment)
Figure 11:
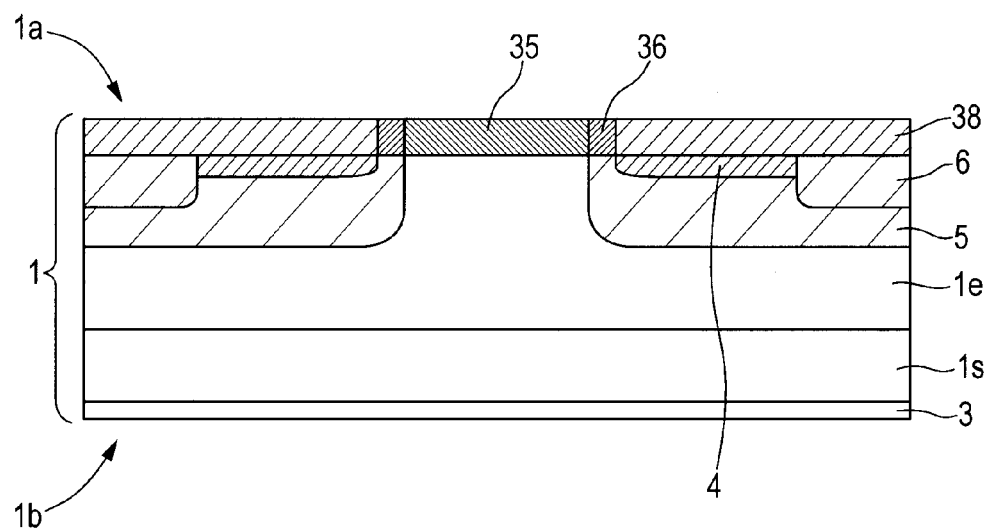
FIG. 11 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of planarizing the thick carbon film for high-temperature heat treatment)
Figure 12:
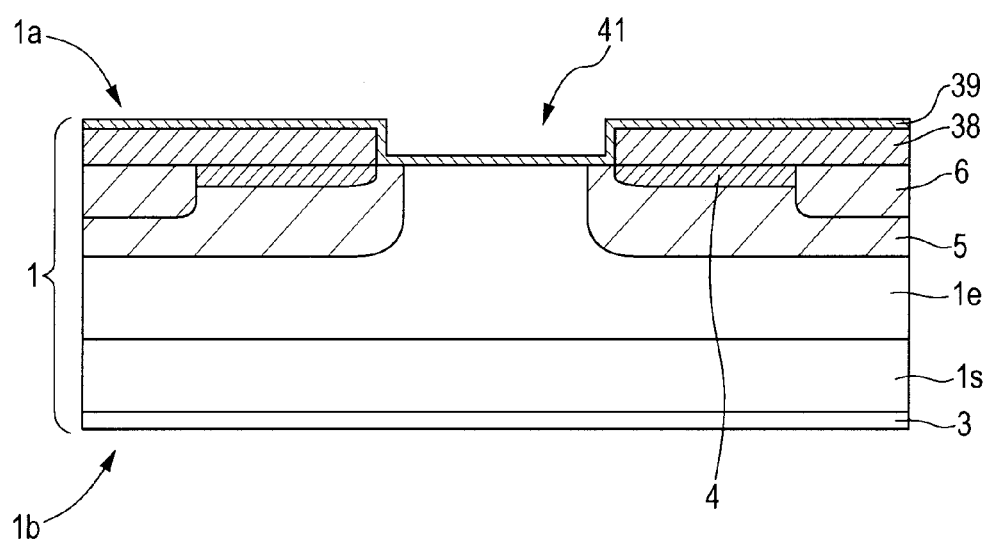
FIG. 12 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of forming a thin carbon film for high-temperature heat treatment)
Figure 13:
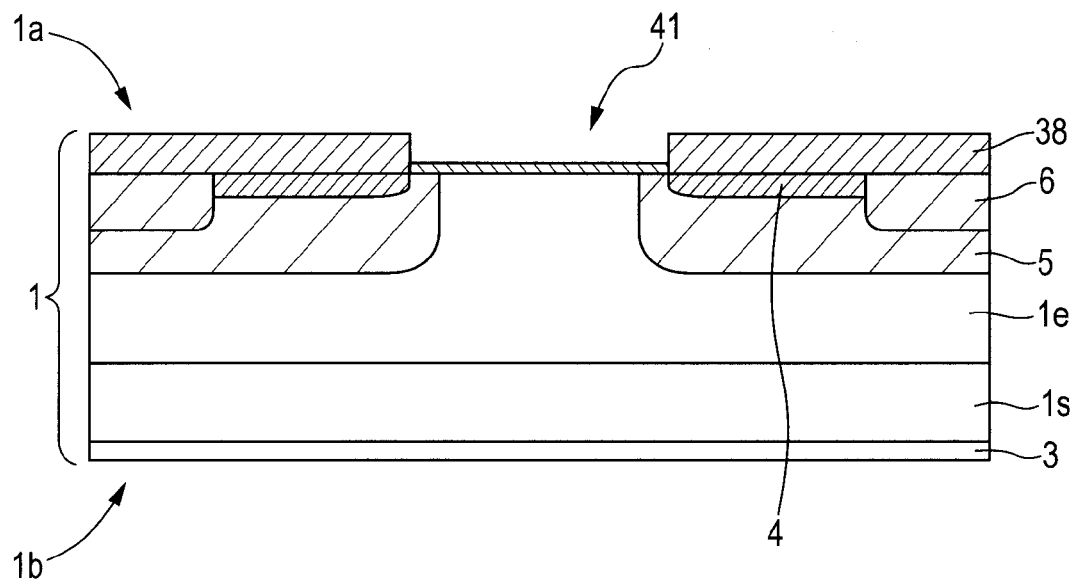
FIG. 13 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of removing the thin carbon film for high-temperature heat treatment)
Figure 14:
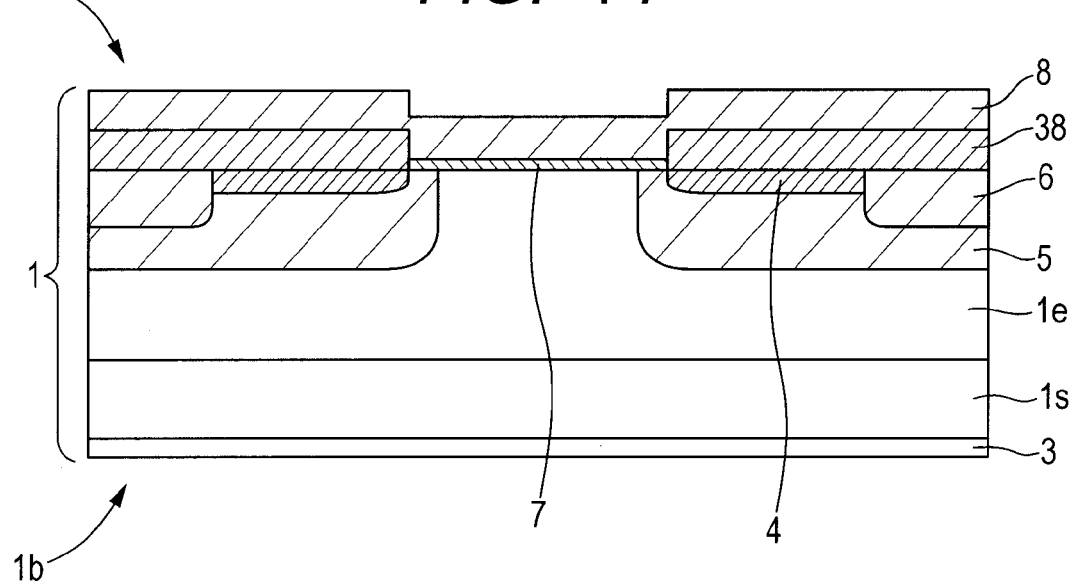
FIG. 14 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of forming a gate insulating film and a gate polysilicon film)
Figure 15:
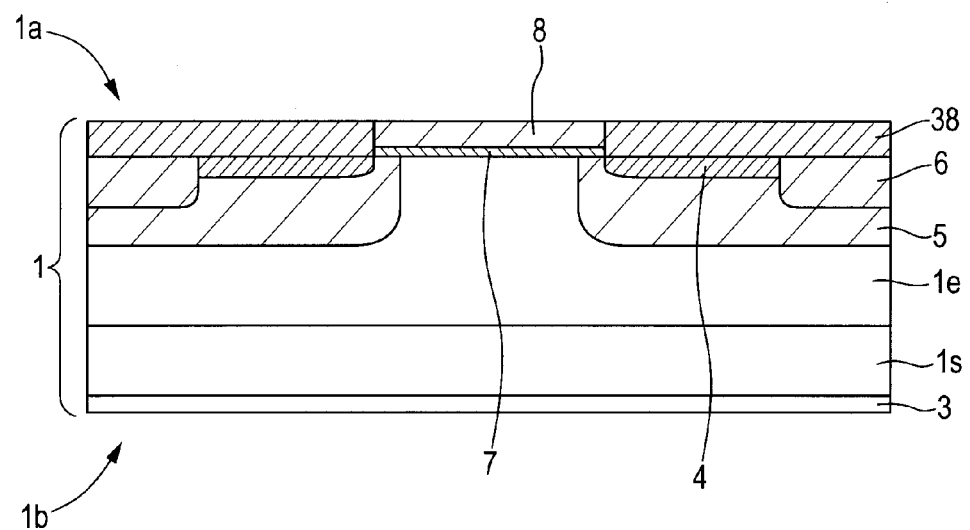
FIG. 15 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of planarizing the gate polysilicon film)
Figure 16:
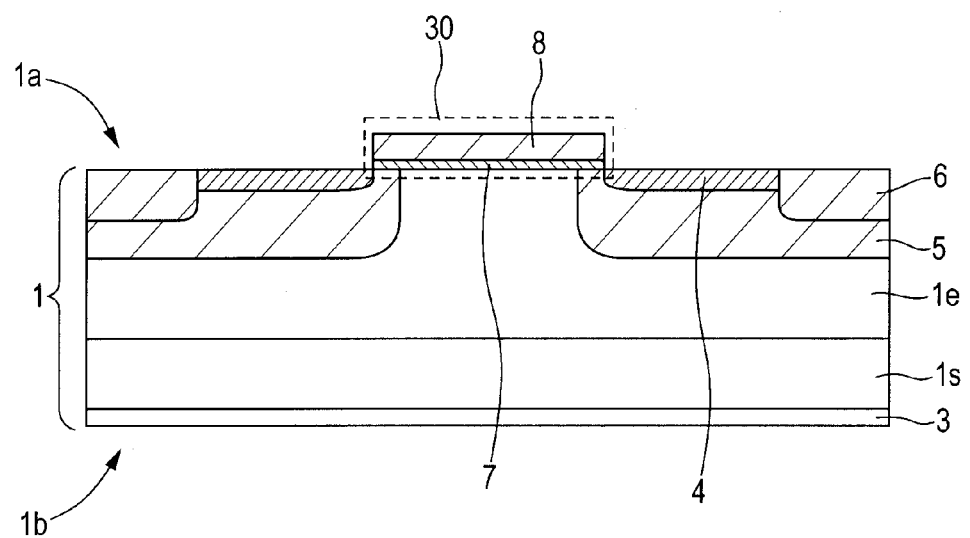
FIG. 16 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of removing the entire thick carbon film for high-temperature heat treatment)
Figure 17:
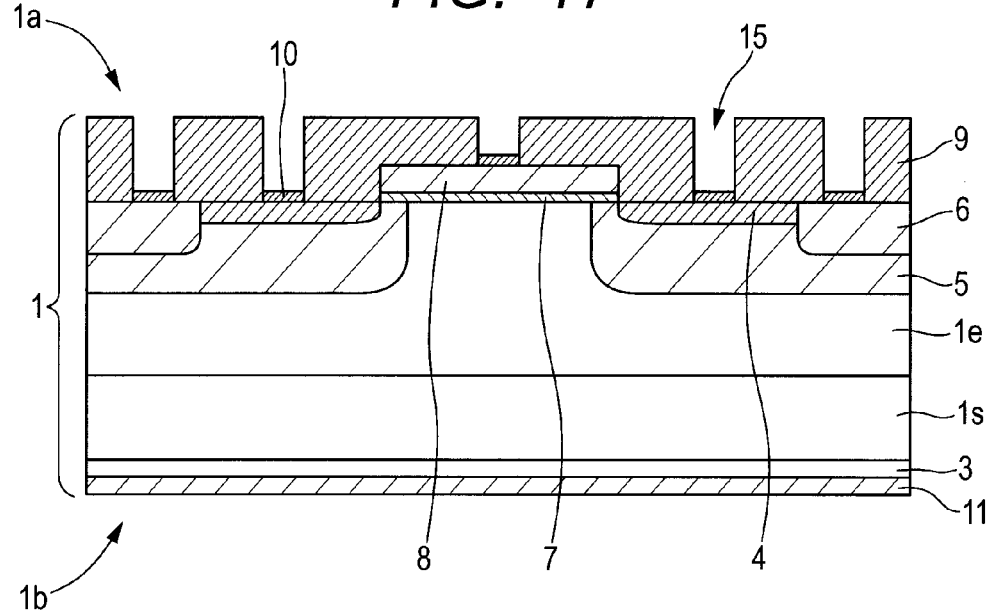
FIG. 17 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of forming a first-layer interlayer insulating film and a silicide film)
Figure 18:
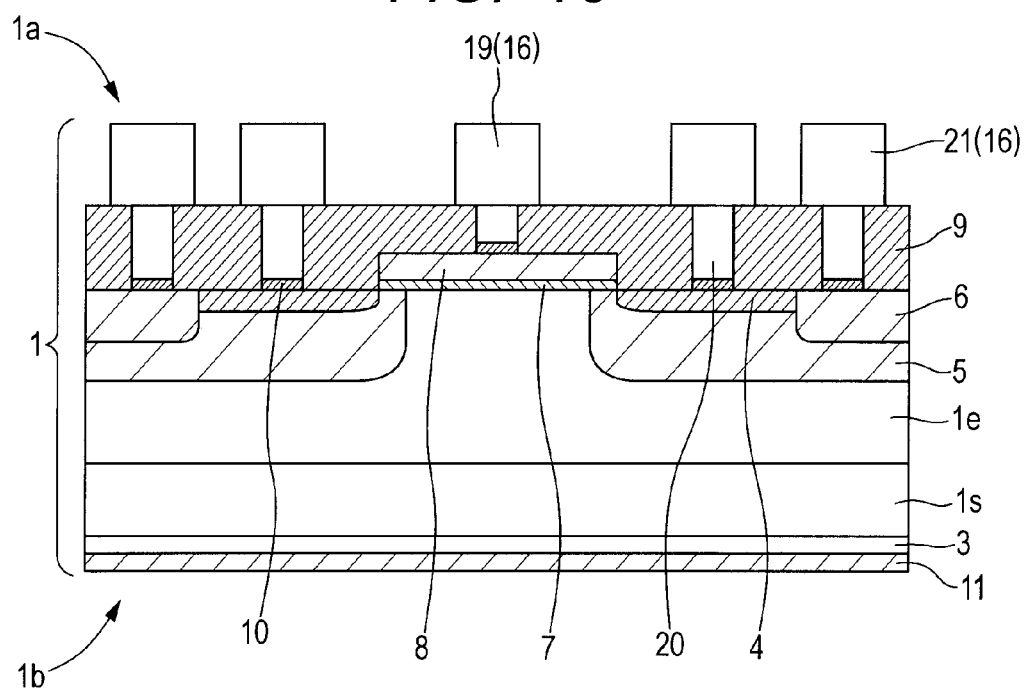
FIG. 18 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of forming a first-layer surface metal film)
Figure 19:
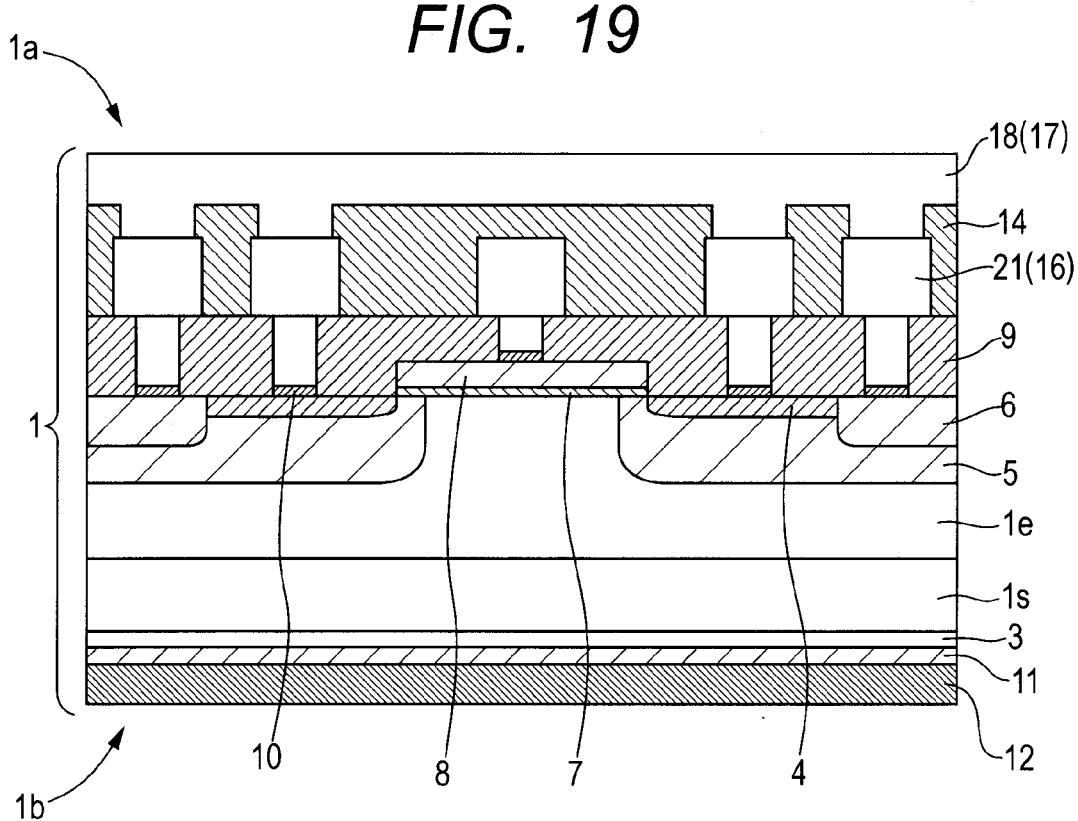
FIG. 19 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of forming a second-layer surface metal film)

FIG. 4 is an overall top view of a single-crystal SiC wafer (epitaxial wafer) used in the manufacturing method of the semiconductor device of the embodiment of the present invention. FIG. 5 is a device cross-sectional view for illustrating the manufacturing method of the semiconductor device of the embodiment of the present invention, which is a device cross-sectional view of a portion corresponding to the' unit periodic region T in the active cell of FIG. 3 in an individual manufacturing step (step of forming a hard mask for introducing channel regions). FIG. 6 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of introducing the channel regions). FIG. 7 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of forming sidewalls). FIG. 8 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of introducing N+ source regions). FIG. 9 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of introducing P+ contact regions). FIG. 10 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of forming a thick carbon film for high-temperature heat treatment). FIG. 11 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of planarizing the thick carbon film for high-temperature heat treatment). FIG. 12 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of forming a thin carbon film for high-temperature heat treatment). FIG. 13 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of removing the thin carbon film for high-temperature heat treatment). FIG. 14 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of forming a gate insulating film and a gate polysilicon film). FIG. 15 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step, of planarizing the gate polysilicon film). FIG. 16 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of removing the entire thick carbon film for high-temperature heat treatment). FIG. 17 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of forming a first-layer interlayer insulating film and a silicide film). FIG. 18 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of forming a first-layer surface metal film). FIG. 19 is a device cross-sectional view for illustrating the manufacturing method of the semiconductor device of the embodiment of the present invention, which is a device cross-sectional view of the portion corresponding to the unit periodic region T in the active cell of FIG. 3 in an individual manufacturing step (step of forming a second-layer surface metal film). Based on these drawings, a description will be given to a manufacturing process in the manufacturing method of the semiconductor device of the embodiment of the present invention.

First, as shown in FIG. 4, the N-type (first-conductivity-type) single-crystal SiC wafer 1 having a thickness of, e.g., about 700 micrometers (in a preferred range of, e.g., about 500 to 1000 micrometers) is prepared. The SiC wafer 1 has a resistivity of, e.g., about 20 mΩ·cm. The SiC wafer 1 (the polytype of which is, e.g., 4H) has a diameter of, e.g., 76 mm (which may also be 100 mm, 150 mm, or a value other than those shown above). As the crystal plane of the main surface, e.g., a (0, 0, 0, 1) plane or a plane equivalent thereto is used. Note that the SiC wafer 1 having a main orientation flat 31 and a sub-orientation flat 32 is used herein, though the use thereof is arbitrary. The crystal orientation is such that the direction of the main orientation flat 31 is, e.g., a [1, −1, 0, 0] direction, and a direction opposite to that of the sub-orientation flat 32 is, e.g., a [1, 1, −2, 0] direction.

Next, as shown in FIG. 5, by introducing an N-type impurity from the back surface 1b of the wafer 1 by, e.g., ion implantation, the N+ heavily doped drain layer 3 is formed. Preferred examples of ion implantation conditions that can be shown include an ion species of, e.g., nitrogen, a dose of, e.g., about $5\times10^{14}/cm^2$, and an implantation energy of, e.g., about 50 KeV. Thereafter, activation annealing is performed (e.g., in an inert gas atmosphere at 1650° C. for about 3 minutes).

Next, in substantially the entire top surface 1a of the wafer 1, the N−epitaxial layer 1e (SiC epitaxial layer or first silicon-carbide-based semiconductor layer) having a thickness of, e.g., about 5 to 10 micrometers) in accordance with a required breakdown voltage is formed by vapor-phase epitaxial growth. Examples of a concentration range of an N-type impurity (e.g., nitrogen) that can be shown include a range of about $1\times10^{16}/cm^3$ to about $2\times10^{16}/cm^3$.

Next, over substantially the entire top surface 1a of the wafer 1, a hard mask film 33 for introducing channel regions having a thickness of, e.g., about 2000 nm is deposited by, e.g., CVD (Chemical Vapor Deposition) using TEOS (Tetraethoxysilane) or the like. Subsequently, onto the hard mask 33 for introducing channel regions, a resist film 34 for introducing channel regions is coated and patterned by typical lithography. Subsequently, using the patterned resist film 34 as a mask, the silicon oxide film 33 is subjected to an anisotropic etching treatment using a fluorocarbon-based etching gas or the like to be patterned.

Next, as shown in FIG. 6, using the hard mask film 33 for introducing channel regions as a mask for ion implantation, the P-type channel regions 5 (P well regions, P base regions, or second-conductivity-type regions) are introduced into the surface region of the N−epitaxial layer 1e by ion implantation. That is, each of the following steps is performed. For instance, as preferred examples of conditions for the ion implantation, the following combinations (1) to (7) can be shown.

(1) an ion species of, e.g., boron, a dose of, e.g., about $1\times10^{12}/cm^2$, and an implantation energy of, e.g., about 600 KeV (2) an ion species of, e.g., boron, a dose of, e.g., about $1\times10^{12}/cm^2$, and an implantation energy of, e.g., about 500 KeV (3) an ion species of, e.g., boron, a dose of, e.g., about $1\times10^{12}/cm^2$, and an implantation energy of, e.g., about 400 KeV (4) an ion species of, e.g., boron, a dose of, e.g., about $1\times10^{12}/cm^2$, and an implantation energy of, e.g., about 300 KeV (5) an ion species of, e.g., boron, a dose of, e.g., about $1\times10^{12}/cm^2$, and an implantation energy of, e.g., about 200 KeV (6) an ion species of, e.g., boron, a dose of, e.g., about $1\times10^{12}/cm^2$, and an implantation energy of, e.g., about 100 KeV (7) an ion species of, e.g., boron, a dose of, e.g., about $1.5\times10^{12}/cm^2$, and an implantation energy of, e.g., about 50 KeV Thereafter, the resist film 34 that is no longer needed is removed by ashing or the like.

Next, as shown in FIG. 7, over substantially the entire top surface 1a of the wafer 1, an insulating film 36 for forming dummy sidewalls each having a thickness of, e.g., about 200 nm is deposited by, e.g., CVD using TEOS or the like. Subsequently, by anisotropic dry etching, the insulating film 36 for forming dummy sidewalls is etched back to form dummy side walls 36.

Next, as shown in FIG. 8, using a dummy gate structure including a dummy gate 35 (hard mask film 33 for introducing channel regions) and the dummy sidewalls 36 as a mask, the N+ source regions 4 are introduced by ion implantation. That is, each of the following steps is performed. For instance, as preferred examples of conditions for the ion implantation, the following combinations (1) to (3) can be shown.

(1) an ion species of, e.g., nitrogen, a dose of, e.g., about $2 \times 10^{14}/cm^2$, and an implantation energy of, e.g., about 75 KeV (2) an ion species of, e.g., nitrogen, a dose of, e.g., about $2 \times 10^{14}/cm^2$, and an implantation energy of, e.g., about 55 KeV (3) an ion species of, e.g., nitrogen, a dose of, e.g., about $2 \times 10^{14}/cm^2$, and an implantation energy of, e.g., about 25 KeV Next, as shown in FIG. 9, onto substantially the entire top surface 1a of the wafer 1, a resist film 37 for introducing P+ contact regions is coated and patterned by normal lithography. Using the patterned resist film 37 for introducing P+ contact regions as a mask, the P+ contact regions 6 are introduced by ion implantation. That is, each of the following steps is performed. For instance, as preferred examples of conditions for the ion implantation, the following combinations (1) to (5) can be shown.

(1) an ion species of, aluminum, a dose of, e.g., about $1 \times 10^{14}/cm^2$, and an implantation energy of, e.g., about 250 KeV (2) an ion species of, e.g., aluminum, a dose of, e.g., about $1 \times 10^{14}/cm^2$, and an implantation energy of, e.g., about 200 KeV (3) an ion species of, e.g., aluminum, a dose of, e.g., about $2 \times 10^{14}/cm^2$, and an implantation energy of, e.g., about 150 KeV (4) an ion species of, e.g., aluminum, a dose of, e.g., about $3 \times 10^{13}/cm^2$, and an implantation energy of, e.g., about 100 KeV (5) an ion species of, e.g., aluminum, a dose of, e.g., about $1 \times 10^{13}/cm^2$, and an implantation energy of, e.g., about 50 KeV.

Thereafter, the resist film 37 that is no longer needed is removed by ashing or the like.

Next, as shown in FIG. 10, over substantially the entire top surface 1a of the wafer 1, a thick carbon film 38 for high-temperature heat treatment having a thickness of, e.g., about 300 nm is deposited by CVD or the like. Preferred examples of conditions for the deposition (plasma CVD) of the carbon film 38 that can be shown include a gas flow rate of $CH_4$/Ar=about 1000 sccm/about 100 sccm, a processing atmospheric pressure of, e.g., about 1.3 kPa, a high-frequency power of, e.g., about 1 kW, and a low-frequency power of, e.g., about 1 kW.

Next, as shown in FIG. 11, surface planarization is performed by, e.g., CMP (Chemical Mechanical Polishing) or the like. Thereafter, using a hydrofluoric-acid-based silicon-oxide-film etchant solution or the like, the dummy gate structure including the dummy gate 35 and the dummy sidewalls 36 is removed.

Next, as shown in FIG. 12, over substantially the entire top surface 1a of the wafer 1, a thin carbon film 39 for high-temperature heat treatment having a thickness of, e.g., about 100 nm is deposited by CVD or the like. Preferred examples of conditions for the deposition (plasma CVD) of the carbon film 39 that can be shown include a gas flow rate of $CH_4$/Ar=about 1000 sccm/about 100 sccm, a processing atmospheric pressure of about 1.3 kPa, a high-frequency power of about 1 kW, and a low-frequency power of about 1 kW. Subsequently, in this state, activation annealing is performed. Preferred examples of conditions for the activation annealing that can be shown include a processing atmosphere of, e.g., an inert gas atmosphere, processing temperature of, e.g., about 1800° C., and processing time of, e.g., about 1 minute.

Next, as shown in FIG. 13, by plasma ashing in, e.g., an oxygen atmosphere or the like, the thin carbon film 39 for high-temperature heat treatment is etched back to form a recessed portion 41 for buried gate (opening or opening pattern of the carbon film).

Next, as shown in FIG. 14, the silicon oxide film-type gate insulating film 7 having a thickness of, e.g., about 50 nm is formed by, e.g., thermal oxidation or the like. Subsequently, over substantially the entire top surface 1a of the wafer 1 thereover, a gate electrode polysilicon film 8 (gate electrode) having a thickness of, e.g., about 300 nm is deposited by CVD or the like. As the gate electrode polysilicon film 8, e.g., a polysilicon film doped with phosphorus is preferred.

Next, as shown in FIG. 15, surface planarization is performed by, e.g., CMP or the like. By the planarization, the gate electrode polysilicon film 8 is patterned into the gate electrode 8.

Next, as shown in FIG. 16, by plasma ashing in, e.g., an oxygen atmosphere or the like, the thick carbon film 38 for high-temperature heat treatment is removed. Thus, the patterning of the gate electrode polysilicon film 8 into the gate structure 30 (structure including the gate electrode 8, the gate insulating film 7, and the like) is completed.

Next, as shown in FIG. 17, over substantially the entire top surface 1a of the wafer 1, the first-layer interlayer insulating film 9 is deposited by CVD or the like. Subsequently, onto substantially the entire top surface 1a of the wafer 1, a resist film for forming contact holes is coated and patterned by normal lithography. Using the patterned resist film for forming contact holes as a mask, the contact holes 15 are formed in the first-layer interlayer insulating film 9 by anisotropic dry etching. Thereafter, the resist film for forming contact holes that is no longer needed is removed. Subsequently, over substantially the entire top surface 1a of the wafer 1, a nickel film having a thickness of, e.g., about 50 nm is deposited by, e.g., sputtering deposition. Subsequently, in an inert gas atmosphere, a silicidation annealing treatment is performed at, e.g., 1000° C. for about 1 minute. Subsequently, unreacted nickel is removed by wet etching. Then, over substantially the entire back surface 1b of the wafer 1, a nickel film having a thickness of, e.g., about 50 nm is deposited by, e.g., sputtering deposition. Subsequently, in an inert gas atmosphere, a silicidation annealing treatment is performed at, e.g., 1000° C. for about 1 minute. By such treatments, the surface silicide films 10 are formed over the top surface 1a of the wafer 1, while the back-surface silicide film 11 is formed on the back surface 1b of the wafer 1.

Next, as shown in FIG. 18, the tungsten plugs 20 are buried in the contact holes 15. Subsequently, over the first-layer interlayer insulating film 9, the first-layer surface metal films 16 (aluminum-based wiring films each having a thickness of, e.g., about 3000 nm) serving as the source lead-out metal wires 21 and the gate lead-out metal wire 19 are formed.

Next, as shown in FIG. 19, over substantially the entire top surface 1a of the wafer 1, the second-layer interlayer insulating film 14 is deposited by CVD or the like. In the same manner as described above, the through holes are formed in the second-layer interlayer insulating film 14. Subsequently, over the second-layer interlayer insulating film 14, the second-layer surface metal film 17 (e.g., an aluminum-based wiring film having a thickness of about 3000 nm) coupled to the source lead-out metal wires 21 is formed and patterned to form the source metal electrode 18 (source pad). Thereafter, as necessary, a final passivation film such as, e.g., a polyimide film is deposited over the top surface 1a of the wafer 1 and patterned. Subsequently, over substantially the entire back surface 1b of the wafer 1, the back-surface metal electrode film 12 (including, e.g., titanium/nickel/gold or like layers shown in order increasing distance from the wafer 1) is formed by, e.g., sputtering. Thereafter, by dicing or the like, the wafer 1 is divided into the individual chips 2.

3. Description of Variation of Manufacturing Process in Manufacturing Method of Semiconductor Device of Embodiment of Present Invention (Based on FIGS. 20 to 26, See Mainly FIGS. 1 to 3 and 5 to 12)

This example is a variation of the example of Section 2 at the stage shown in FIGS. 13 to 19. Accordingly, this example is exactly the same as the example of Section 2 at the stage shown in FIGS. 5 to 12 so that the description thereof will not be repeated.

Figure 20:
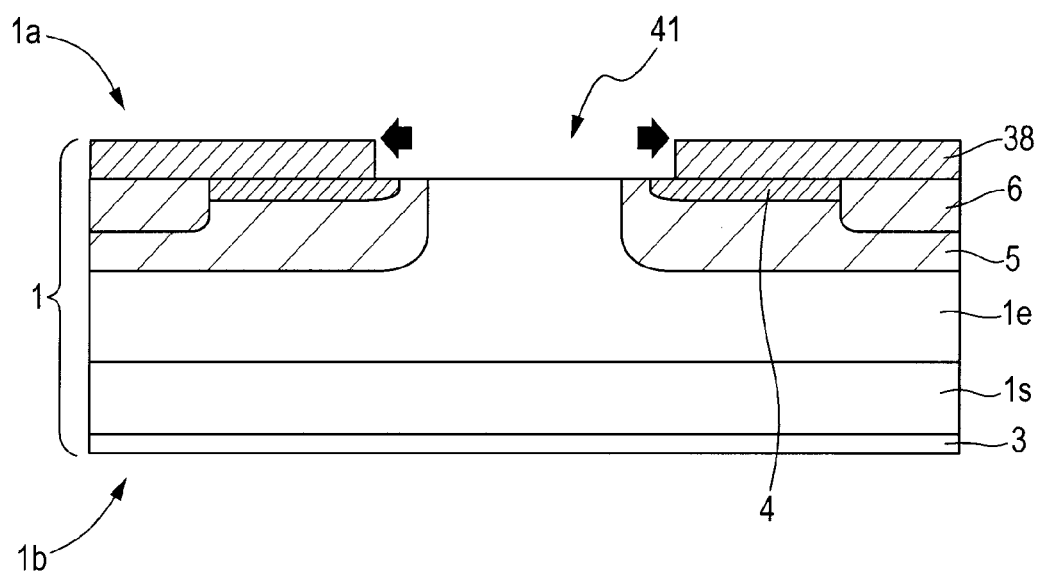
FIG. 20 is a device cross-sectional view for illustrating a manufacturing method of a semiconductor device (variation) of the embodiment of the present invention, which is a device cross-sectional view of the portion corresponding to the unit periodic region T in the active cell of FIG. 3 in an individual manufacturing step (step of enlarging the opening in the carbon film for high-temperature heat treatment)
Figure 21:
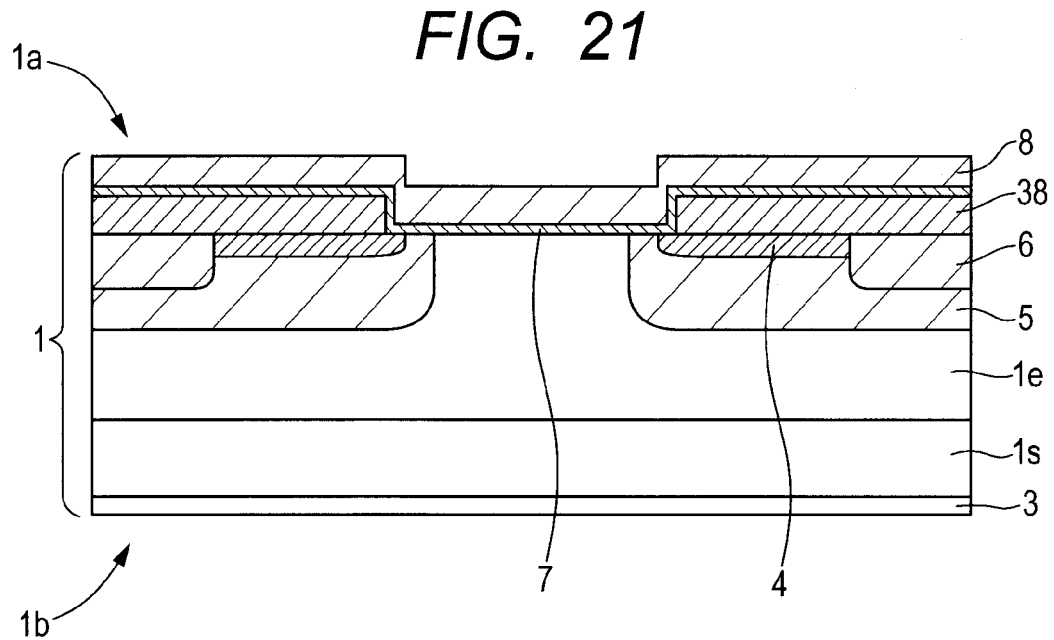
FIG. 21 is a device cross-sectional view for illustrating the manufacturing method of the semiconductor device (variation) of the embodiment of the present invention, which is a device cross-sectional view of the portion corresponding to the unit periodic region T in the active cell of FIG. 3 in an individual manufacturing step (step of forming the gate insulating film and the gate polysilicon film)
Figure 22:
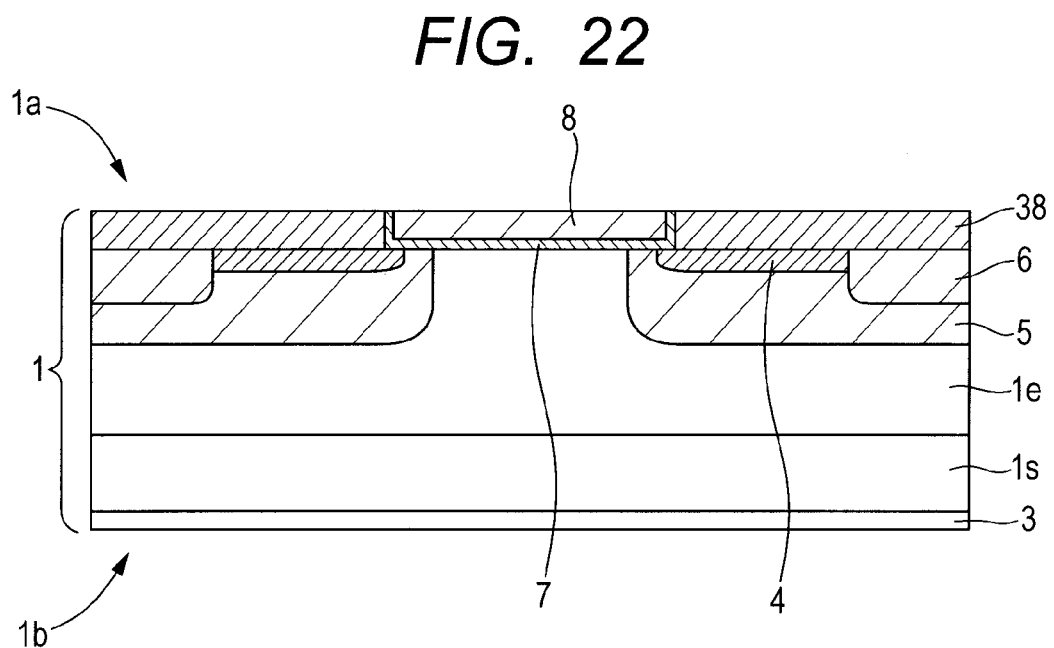
FIG. 22 is a device cross-sectional view for illustrating the manufacturing method of the semiconductor device (variation) of the embodiment of the present invention, which is a device cross-sectional view of the portion corresponding to the unit periodic region T in the active cell of FIG. 3 in an individual manufacturing step (step of planarizing the gate polysilicon film)
Figure 23:
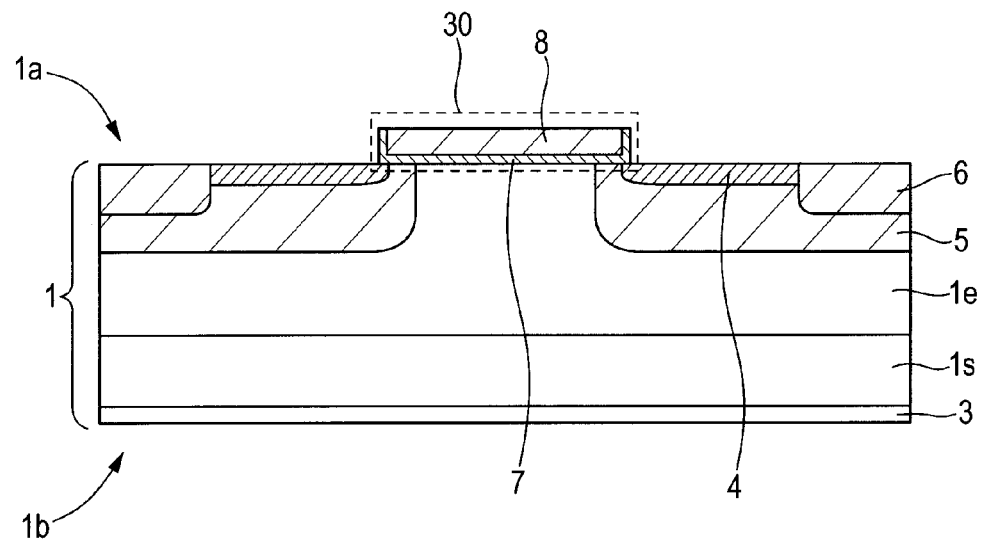
FIG. 23 is a device cross-sectional view for illustrating the manufacturing method of the semiconductor device (variation) of the embodiment of the present invention, which is a device cross-sectional view of the portion corresponding to the unit periodic region T in the active cell of FIG. 3 in an individual manufacturing step (step of removing the entire thick carbon film for high-temperature heat treatment)
Figure 24:
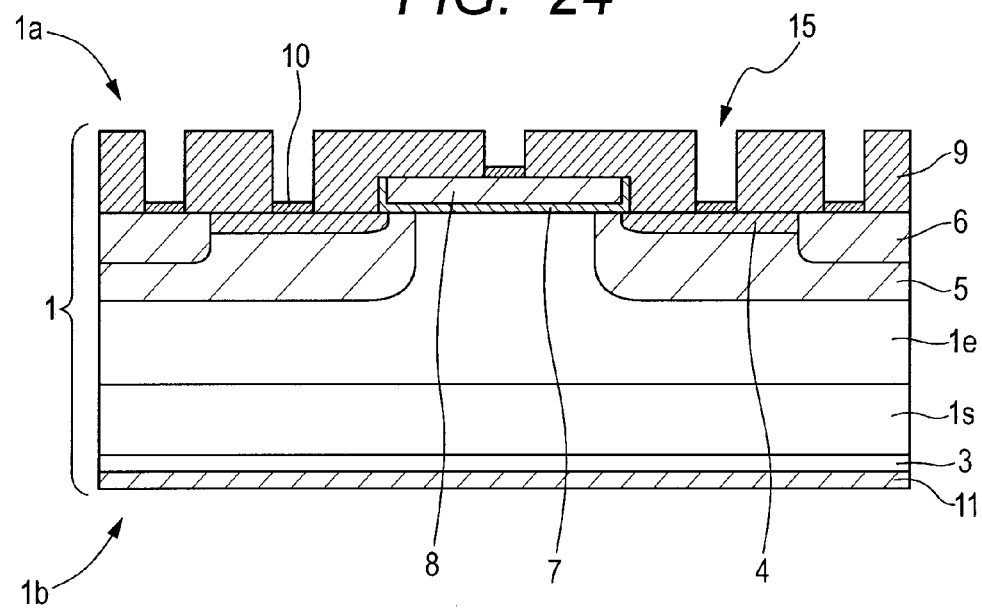
FIG. 24 is a device cross-sectional view for illustrating the manufacturing method of the semiconductor device (variation) of the embodiment of the present invention, which is a device cross-sectional view of the portion corresponding to the unit periodic region T in the active cell of FIG. 3 in an individual manufacturing step (step of forming the first-layer interlayer insulating film and the silicide film)
Figure 25:
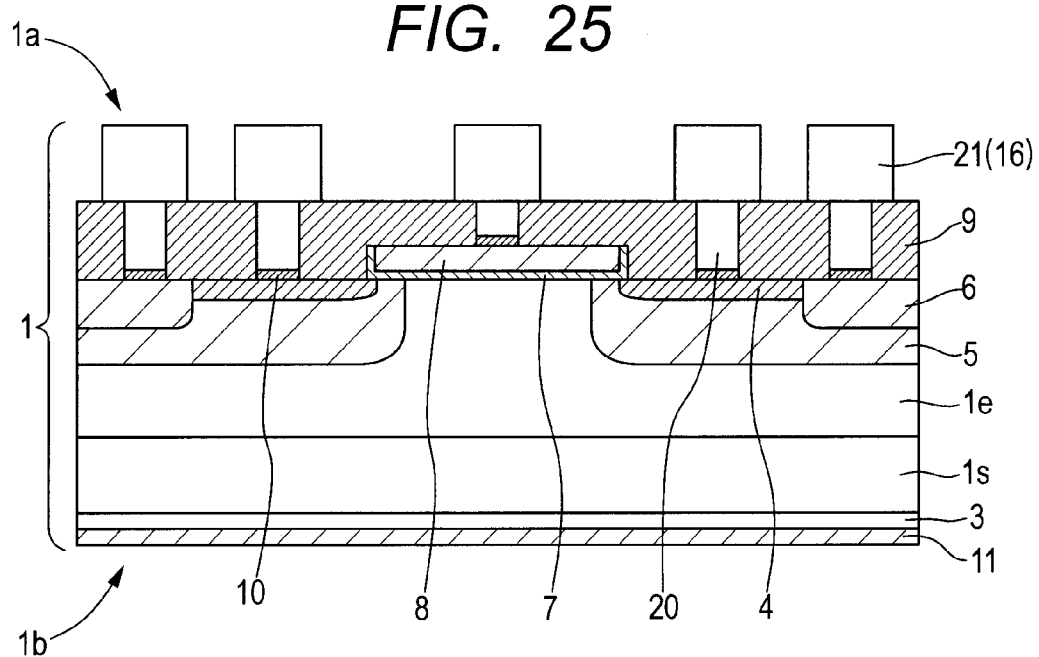
FIG. 25 is a device cross-sectional view for illustrating the manufacturing method of the semiconductor device (variation) of the embodiment of the present invention, which is a device cross-sectional view of the portion corresponding to the unit periodic region T in the active cell of FIG. 3 in an individual manufacturing step (step of forming the first-layer surface metal film)
Figure 26:
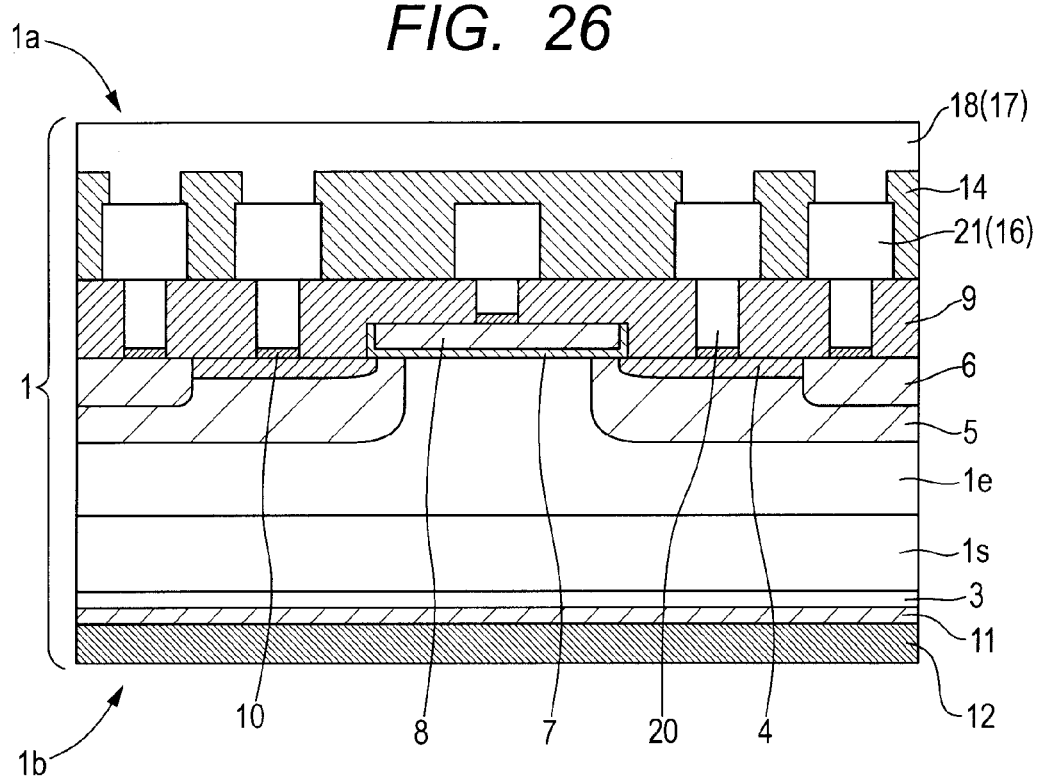
FIG. 26 is a device cross-sectional view for illustrating the manufacturing method of the semiconductor device (variation) of the embodiment of the present invention, which is a device cross-sectional view of the portion corresponding to the unit periodic region T in the active cell of FIG. 3 in an individual manufacturing step (step of forming the second-layer surface metal film).

FIG. 20 is a device cross-sectional view for illustrating a manufacturing method of a semiconductor device (variation) of the embodiment of the present invention, which is a device cross-sectional view of the portion corresponding to the unit periodic region T in the active cell of FIG. 3 in an individual manufacturing step (step of enlarging the opening in the carbon film for high-temperature heat treatment). FIG. 21 is a device cross-sectional view for illustrating the manufacturing method of the semiconductor device (variation) of the embodiment of the present invention, which is a device cross-sectional view of the portion corresponding to the unit periodic region T in the active cell of FIG. 3 in an individual manufacturing step (step of forming the gate insulating film and the gate polysilicon film). FIG. 22 is a device cross-sectional view for illustrating the manufacturing method of the semiconductor device (variation) of the embodiment of the present invention, which is a device cross-sectional view of the portion corresponding to the unit periodic region T in the active cell of FIG. 3 in an individual manufacturing step (step of planarizing the gate polysilicon film). FIG. 23 is a device cross-sectional view for illustrating the manufacturing method of the semiconductor device (variation) of the embodiment of the present invention, which is a device cross-sectional view of the portion corresponding to the unit periodic region T in the active cell of FIG. 3 in an individual manufacturing step (step of removing the entire thick carbon film for high-temperature heat treatment). FIG. 24 is a device cross-sectional view for illustrating the manufacturing method of the semiconductor device (variation) of the embodiment of the present invention, which is a device cross-sectional view of the portion corresponding to the unit periodic region T in the active cell of FIG. 3 in an individual manufacturing step (step of forming the first-layer interlayer insulating film and the silicide film). FIG. 25 is a device cross-sectional view for illustrating the manufacturing method of the semiconductor device (variation) of the embodiment of the present invention, which is a device cross-sectional view of the portion corresponding to the unit periodic region T in the active cell of FIG. 3 in an individual manufacturing step (step of forming the first-layer surface metal film). FIG. 26 is a device cross-sectional view for illustrating the manufacturing method of the semiconductor device (variation) of the embodiment of the present invention, which is a device cross-sectional view of the portion corresponding to the unit periodic region T in the active cell of FIG. 3 in an individual manufacturing step (step of forming the second-layer surface metal film). Based on these drawings, a description will be given to a variation of the manufacturing process in the manufacturing method of the semiconductor device of the embodiment of the present invention.

As shown in FIG. 20, by plasma ashing in, e.g., an oxygen atmosphere or the like, the thin carbon film 39 for high-temperature heat treatment is etched back to form the recessed portion 41 for buried gate (opening or opening pattern of the carbon film). At this time, unlike in the case of FIG. 13, not only the thin carbon film 39 for high-temperature heat treatment is etched back to expose the top surface of the N−epitaxial layer 1e, but also the thick carbon film 38 for high-temperature heat treatment is caused to recede in a lateral direction (on both sides in the lateral direction) by a distance corresponding to the thickness of the CVD gate insulating film 7 described later.

Next, as shown in FIG. 21, over substantially the entire top surface 1a of the wafer 1, the alumina (aluminum-oxide) film-type gate insulating film 7 having a thickness of, e.g., about 50 nm is formed by, e.g., ALD (Atomic Layer Deposition) or the like. Subsequently, over substantially the entire top surface 1a of the wafer 1 thereover, the gate electrode polysilicon film 8 (gate electrode) having a thickness of, e.g., about 300 nm is deposited by CVD or the like. As the gate electrode polysilicon film 8, e.g., a polysilicon film doped with phosphorus is preferred.

Next, as shown in FIG. 22, surface planarization is performed by, e.g., CMP or the like. By the planarization, the gate electrode polysilicon film 8 is patterned into the gate electrode 8.

Next, as shown in FIG. 23, by plasma ashing in, e.g., an oxygen atmosphere or the like, the thick carbon film 38 for high-temperature heat treatment is removed. Thus, the patterning of the gate electrode polysilicon film 8 into the gate structure 30 (structure including the gate electrode 8, the gate insulating film 7, and the like) is completed.

Next, as shown in FIG. 24, over substantially the entire top surface 1a of the wafer 1, the first-layer interlayer insulating film 9 is deposited by CVD or the like. Subsequently, onto substantially the entire top surface 1a of the wafer 1, a resist film for forming contact holes is coated and patterned by normal lithography. Using the patterned resist film for forming contact holes as a mask, the contact holes 15 are formed in the first-layer interlayer insulating film 9 by anisotropic dry etching. Thereafter, the resist film for forming contact holes that is no longer needed is removed. Subsequently, over substantially the entire top surface 1a of the wafer 1, a nickel film having a thickness of, e.g., about 50 nm is deposited by, e.g., sputtering deposition. Subsequently, in an inert gas atmosphere, a silicidation annealing treatment is performed at, e.g., 1000° C. for about 1 minute. Subsequently, unreacted nickel is removed by wet etching. Then, over substantially the entire back surface 1b of the wafer 1, a nickel film having a thickness of, e.g., about 50 nm is deposited by, e.g., sputtering deposition. Subsequently, in an inert gas atmosphere, a silicidation annealing treatment is performed at, e.g., 1000° C. for about 1 minute. By such treatments, the surface silicide films 10 are formed over the top surface 1a of the wafer 1, while the back-surface silicide film 11 is formed on the back surface 1b of the wafer 1.

Next, as shown in FIG. 25, the tungsten plugs 20 are buried in the contact holes 15. Subsequently, over the first-layer interlayer insulating film 9, the first-layer surface metal films 16 (aluminum-based wiring films each having a thickness of, e.g., about 3000 nm) serving as the source lead-out metal wires 21 and the gate lead-out metal wire 19 are formed.

Next, as shown in FIG. 26, over substantially the entire top surface 1a of the wafer 1, the second-layer interlayer insulating film 14 is deposited by CVD or the like. In the same manner as described above, the through holes are formed in the second-layer interlayer insulating film 14. Subsequently, over the second-layer interlayer insulating film 14, the second-layer surface metal film 17 (e.g., an aluminum-based wiring film having a thickness of about 3000 nm) coupled to the source lead-out metal wires 21 is formed and patterned to form the source metal electrode 18 (source pad). Thereafter, as necessary, a final passivation film such as, e.g., a polyimide film is deposited over the top surface 1a of the wafer 1 and patterned. Subsequently, over substantially the entire back surface 1b of the wafer 1, the back-surface metal electrode film 12 (including, e.g., titanium/nickel/gold or like layers shown in order of increasing distance from the wafer 1) is formed by, e.g., sputtering. Thereafter, by dicing or the like, the wafer 1 is divided into the individual chips 2.

4. Consideration and Supplemental Description of Above Embodiment (1) With Regard to Section 2 (Description Given Below is Common to Section 3 Except for Portion Particularly Specified to be Different)

In the example of Section 2, in FIG. 6, the edges of the P-type channel regions 5 (P well regions, P base regions, or second-conductivity-type regions) are self-alignedly defined by the both edges of the dummy gate 35 (hard mask film 33 for introducing channel regions) (primary self alignment processing, i.e., dummy gate alignment processing).

In addition, in FIG. 8, the edges of the N+ source regions 4 are defined at the both edges of the dummy sidewalls 36 (secondary self alignment processing, i.e., dummy sidewall alignment processing). Thus, the N+ source regions 4 are introduced in self-aligned relation with the P-type channel regions 5 (P well regions, P base regions, or second-conductivity-type regions). In other words, the self alignment is performed using the dummy sidewalls (or sidewalls). In particular, by forming the dummy sidewalls (or sidewalls) of silicon-based insulating films (silicon oxide films, silicon nitride films, or the like), high-precision self-alignment is easily achieved.

Moreover, by the edges of the N+ source regions 4, the both edges of the gate structure 30 are defined (ternary self-alignment processing, i.e., carbon film opening pattern alignment processing). Thus, the gate structure 30 (more specifically, the gate insulating film 7 and the gate electrode 8) is formed in self-aligned relation with the N+ source regions 4. In other words, self-alignment of the gate electrode 30 is performed using an opening pattern of protective carbon film (reverse pattern of the protective carbon film) during activation annealing.

Each of such self-alignment processings has the effect of facilitating high-precision control of device characteristics.

Note that, in a SiC-based device, activation annealing is normally performed at a temperature not less than a softening temperature of a silicon oxide film or the like. Therefore, a method which forms the gate structure 30 after activation annealing, i.e., a gate-last method is effective.

(2) With Regard to Section 3

With regard to FIGS. 6 to 8, the example of Section 3 is exactly the same as the example of Section 2 but, in FIG. 20 (corresponding to FIG. 13 in the example of Section 2), a correction corresponding to the thickness of the gate insulating film 7 is made in the gate structure 30 so as to define the both edges of the gate electrode 8. This is because, in the example of Section 2, the both edges of the gate electrode 8 coincide with those of the gate insulating film 7 while, in the example of Section 3, the edges of the gate electrode 8 and the gate insulating film 7 are each shifted by a distance corresponding to the thickness of the gate insulating film 7 on both sides of the gate electrode 8.

In this example, the gate insulating film 7 is deposited by practicing a foreign method such as CVD or sputtering deposition. As a result, unlike in the case of a thermally oxidized silicon film, any film can be deposited independently of the characteristics of the underlie, i.e., SiC. Therefore, it is possible to achieve stable insulating film characteristics and a relatively high channel mobility. That is, when consideration is given to the fact that, in a silicon-carbide-based device, improving the characteristics of a thermal oxide film has become a challenge to be met due to the presence of carbon atoms, as far as such a challenge is concerned, it is more advantageous to use a foreign insulating film than a thermally oxidized gate insulating film.

5. Summary

While the invention achieved by the present inventors has been specifically described heretofore based on the embodiment thereof, the present invention is not limited thereto. It will be appreciated that various changes and modifications can be made in the invention within the scope not departing from the gist thereof.

For example, in the foregoing embodiment, the specific description has been given mainly to the N-channel power MISFET, but the present invention is not limited thereto. It will be appreciated that the present invention is also applicable to a P-channel power MISFET. Also, in the foregoing embodiment, the specific description has been given mainly to an active device (such as FET, IGBT, or diode) using a silicon-carbide-based semiconductor substrate (the polytype of which is not limited to 4 H, and may also be another) of SiC or the like, but the present invention is not limited thereto. It will be appreciated that the present invention is also applicable to a GaN-based active device. Also, in the foregoing embodiment, the specific description has been given mainly to the planar type, but the present invention is not limited thereto. It will be appreciated that the present invention is also similarly applicable to the trench type.

Also, in the foregoing embodiment, a specific description has been given using the double-layer aluminum-based wiring as an example of the wires and the lead-out wires to the pad or the like, but the present invention is not limited thereto. It will be appreciated that single-layer wiring, multilayer wiring including three or more layers, non-aluminum-based single-layer wiring or multi-layer wiring can also be used appropriately.

What is claimed is:

1. A method of manufacturing a semiconductor device, comprising the steps of:
   (a) preparing a semiconductor wafer having, in a first main surface of a silicon-carbide-based semiconductor substrate having a first conductivity type, a first silicon-carbide-based semiconductor layer having the same conductivity type as the first conductivity type and a concentration lower than that of the semiconductor substrate;
   (b) introducing, into a surface region of the first silicon-carbide-based semiconductor layer closer to the first main surface, a second-conductivity-type region having a second conductivity type opposite to the first conductivity type and serving as a channel region of a vertical power MISFET;

(c) introducing a source region of the vertical power MISFET having the same conductivity type as the first conductivity type and a concentration higher than that of the first silicon-carbide-based semiconductor layer in self-aligned relation with the second-conductivity-type region;

(d) after step (c), performing an activation anneal treatment for the second-conductivity-type region and the source region; and (e) after step (d), forming a gate structure of the vertical power MISFET in self-aligned relation with the source region, wherein the first silicon-carbide-based semiconductor layer is an epitaxial layer, wherein self-alignment of the source region with the second-conductivity-type region is performed using sidewalls each formed of a silicon-based insulating film, and wherein self-alignment of the gate structure with the source region is performed using an opening pattern of a carbon film.

2. A method of manufacturing a semiconductor device according to claim 1,
wherein a gate insulating film forming the gate structure is a thermal oxide film.

3. A method of manufacturing a semiconductor device according to claim 1,
wherein a gate insulating film forming the gate structure is an insulating film deposited by CVD.

4. A method of manufacturing a semiconductor device according to claim 3,
wherein the CVD is ALD.

5. A method of manufacturing a semiconductor device according to claim 4,
wherein the gate insulating film forming the gate structure has an alumina-based insulating film.

6. A method of manufacturing a semiconductor device according to claim 5, further comprising the step of:
(f) after the step (e) and prior to the step (d), enlarging the opening pattern of the carbon film by a dimension substantially equal to a thickness of the gate insulating film.

7. A method of manufacturing a semiconductor device according to claim 1,
wherein the first main surface of the semiconductor substrate is a (0001) plane or a plane equivalent thereto.

* * * * *